United States Patent
Hsieh et al.

(10) Patent No.: US 9,537,205 B2
(45) Date of Patent: Jan. 3, 2017

(54) 3D ANTENNA FOR INTEGRATED CIRCUITS

(71) Applicant: TAIWAN SEMICONDUCTOR MANUFACTURING COMPANY, LTD., Hsinchu (TW)

(72) Inventors: Jeng-Shieh Hsieh, Kaohsiung (TW); Chung-Hao Tsai, Huatan Township (TW); Chuei-Tang Wang, Hsinchu (TW); Chen-Hua Yu, Hsinchu (TW)

(73) Assignee: Taiwan Semiconductor Manufacturing Company, LTd., Hsin-Chu (TW)

( * ) Notice: Subject to any disclaimer, the term of this patent is extended or adjusted under 35 U.S.C. 154(b) by 246 days.

(21) Appl. No.: 14/075,252

(22) Filed: Nov. 8, 2013

(65) Prior Publication Data

US 2015/0130681 A1    May 14, 2015

(51) Int. Cl.
*H01Q 1/38* (2006.01)
*H01Q 1/36* (2006.01)
*H01Q 1/22* (2006.01)
*H01L 23/48* (2006.01)
*H01L 23/498* (2006.01)
*H01L 23/522* (2006.01)

(52) U.S. Cl.
CPC ............... *H01Q 1/38* (2013.01); *H01Q 1/362* (2013.01); *H01L 23/481* (2013.01); *H01L 23/49822* (2013.01); *H01L 23/5227* (2013.01); *H01L 2924/0002* (2013.01); *H01Q 1/2283* (2013.01)

(58) Field of Classification Search
CPC ..... H01Q 1/38; H01Q 21/0006; H01Q 9/0414
USPC ............. 343/700 MS, 895, 873; 257/86, 132
See application file for complete search history.

(56) References Cited

U.S. PATENT DOCUMENTS

| | | | | |
|---|---|---|---|---|
| 4,672,386 A | * | 6/1987 | Wood | H01Q 21/24 343/770 |
| 5,870,065 A | * | 2/1999 | Kanba | H01Q 1/38 343/787 |
| 6,114,997 A | * | 9/2000 | Lee | H01Q 1/38 343/700 MS |
| 7,295,161 B2 | * | 11/2007 | Gaucher | H01L 24/48 235/492 |
| 8,810,475 B2 | * | 8/2014 | Maeda | H01Q 1/36 343/700 MS |
| 8,988,299 B2 | * | 3/2015 | Kam | H01Q 1/2283 257/E21.499 |

(Continued)

*Primary Examiner* — Dameon E Levi
*Assistant Examiner* — Awat Salih
(74) *Attorney, Agent, or Firm* — Slater Matsil, LLP (57) ABSTRACT

An antenna comprises a first layer having a first redistribution layer, a feeding line, a ground connection element, and one or more antenna inputs. The antenna also comprises one or more intermediate layers over the first layer. The antenna further comprises a second layer having a second redistribution layer over the one or more intermediate layers. The antenna additionally comprises one or more through vias arranged to communicatively couple the second redistribution layer and the first redistribution layer. The antenna also comprises a short element. The antenna further comprises one or more radiator antennas within the one or more through vias, the one or more radiator antennas being in communication with the one or more antenna inputs by way of the feeding line.

19 Claims, 7 Drawing Sheets

(56) References Cited

U.S. PATENT DOCUMENTS

| | | | |
|---|---|---|---|
| 2002/0009577 A1* | 1/2002 | Takaya | H03H 7/0115 |
| | | | 428/209 |
| 2003/0080904 A1* | 5/2003 | Chen | H01Q 1/243 |
| | | | 343/700 MS |
| 2004/0113840 A1* | 6/2004 | Gottwald | H01Q 1/3233 |
| | | | 343/700 MS |
| 2004/0119653 A1* | 6/2004 | Asakura | H01Q 1/22 |
| | | | 343/702 |
| 2009/0201211 A1* | 8/2009 | Saily | H01Q 1/243 |
| | | | 343/702 |
| 2010/0090903 A1* | 4/2010 | Byun | H01Q 9/0407 |
| | | | 343/700 MS |
| 2014/0091440 A1* | 4/2014 | Nair | H01L 24/24 |
| | | | 257/E21.499 |

* cited by examiner

3D ANTENNA FOR INTEGRATED CIRCUITS

BACKGROUND

Device manufacturers are continually challenged to deliver value and convenience to consumers by, for example, providing quality wireless communication antennas that offer efficient performance and reduced size. Conventional on-die and on-substrate antennas often associated with integrated circuits limit the capable range and quality of various wireless communications and inhibit the continual development of integrated circuits designed to occupy a minimal space.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Some wireless communication antennas include on-die antennas and/or on-substrate antennas. On-die antennas are large with respect to certain radio frequency (RF) dies with which on-die antennas are associated. On-die antennas also have poor "gain" such as −3 dBi because of loss to a silicon material which often makes up the die.

Gain is a performance parameter that combines an antenna's directivity and electrical efficiency. As a transmitting antenna, gain describes how well the antenna converts input power into radio waves headed in a specified direction. As a receiving antenna, gain describes how well the antenna converts radio waves arriving from a specified direction into electrical power. When no direction is specified, gain is understood to refer to the peak value of the gain. Gain is a passive phenomenon. Power is not added by the antenna, but rather is redistributed to provide more radiated power in a certain direction than would be transmitted by an isotropic antenna. High-gain antennas have the advantage of longer range and better signal quality. Low-gain antennas have a shorter range.

Poor efficiency, such as an efficiency of only 30%, is common for most on-die antennas having a gain on the order of −3 dBi. This poor efficiency and lost gain limit a potential communication distance of an on-die antenna.

On-substrate antennas offer gain of about 0 dBi which is an improvement over on-die antennas because loss to the silicon die, for example, is eliminated or minimized, but on-substrate antennas are even larger than on-die antennas, not only in length and width, but also height.

Accordingly, an antenna according to one or more embodiments that improves gain beyond both the loss experienced by common on-die antennas and the 0 dBi gain offered by on-substrate antennas while being packaged in a wafer-level structure would be advantageous to improve antenna and communication performance, reduce die size, and reduce manufacturing costs.

Figure 1A:
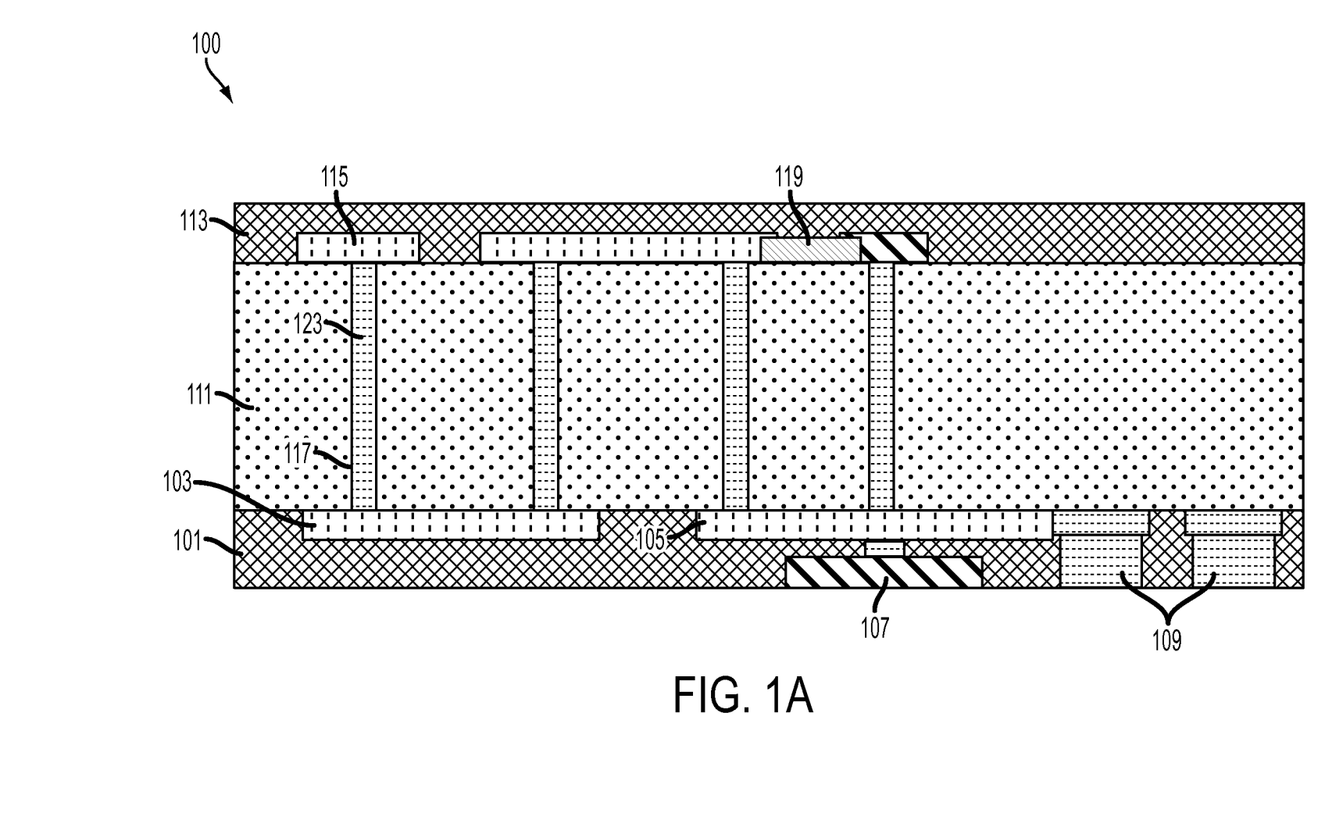
FIG. 1A is a diagram of a three-dimensional antenna in a wafer-level structure, in accordance with one or more embodiments.

FIG. 1A is a diagram of a three-dimensional antenna 100 in a wafer-level structure, in accordance with one or more embodiments. The antenna 100 comprises a first layer 101 comprising a first redistribution layer 103, a feeding line 105, a ground connection element 107, and one or more antenna inputs 109.

The antenna 100 also comprises one or more layers 111 over the first layer 101 and a second layer 113 comprising a second redistribution layer 115 over the one or more intermediate layers 111. The antenna 100 further includes one or more through vias 117 connecting one or more layers in first layer 101 with one or more layers in second layer 113 and a short element 119. One or more radiator antennas 123 are disposed within the one or more through vias 117. The one or more radiator antennas 123 are in communication with the one or more antenna inputs 109 by way of the feeding line 105. In some embodiments, the one or more radiator antennas 123 comprise a conductive material comprising one or more of gold, copper, cobalt, aluminum, or other suitable material.

The one or more through vias 117 are arranged to communicatively couple the second redistribution layer 115 and the first redistribution layer 103 through the one or more intermediate layers 111. As such, in some embodiments, the one or more through vias 117 comprise one or more of through silicon vias (TSV), inter-layer vias (ILV), through glass vias (TGV), through molding vias (TMV), or other type of via formed through a material of a layer of the antenna 100 such as, but not limited to, glass, polymers, silicon, other substrate materials, silicon interposers, silicon-on-insulators, high resistivity silicon, package/assembly materials, encapsulating materials, epoxies, and the like that are included in any intermediate layer 111, first layer 101, second layer 113, or other layer associated with an integrated circuit with which the antenna 100 is associated or a layer of the antenna 100.

In some embodiments, the one or more through vias 117 are orthogonal with respect to a surface of the first layer 101. In other embodiments, the one or more through vias are arranged in a different orientation with respect to first layer 101. In some embodiments, the one or more through vias 117 are all arranged having a same orientation with respect to a surface of the first layer 101. In other embodiments, some of the one of more through vias 117 are arranged in a crisscross pattern or webbed pattern.

Though illustrated as having at least four through vias 117, the quantity of through vias 117, in some embodiments, is as few as one, while in other embodiments the quantity of through vias 117 is a positive, non-zero integer N. As such, while the first redistribution layer 103 and the second redistribution layer 115 are illustrated as coupling some of the through vias 117 and materials therein, the first redistribution layer 103 and/or the second redistribution layer 115 are configured, in some embodiments, to isolate at least some of the through vias 117. For example, portions of the first redistribution layer 103 and/or the second redistribution layer 115, such as those within the illustrated dashed lines in each of the first redistribution layer 103 and the second redistribution layer 115, are capable of being excluded from the redistribution layers 103, 115 to isolate particular through vias 117.

The antenna 100 is a monopole antenna. In some embodiments, the antenna 100 comprises through via 117 to form a monopole antenna. In other embodiments, the antenna 100 is a monopole antenna including more than one through via 117, the monopole antenna structure being dependent on an arrangement of the more than one through vias. In further embodiments, the antenna 100 is a multiple patch antenna. In other embodiments, the antenna 100 is a dipole antenna.

In some embodiments, the first redistribution layer 103 is arranged in the first layer 101 to comprise the feeding line 105 and the ground connection element 107. In some embodiments, the ground connection element 107 is a separately formed element from the first redistribution layer 103.

In some embodiments, the short element 119 is configured to adjust a bandwidth of the antenna 100. The bandwidth of the antenna 100 is adjustable based, at least in part, on a sizing and/or positioning of the short element 119. For example, the short element 119 is configurable to have any length, width and height. A variation in the length, width and/or height of the short element 119 to a specified combination of values causes the antenna 100 to be set at a specific bandwidth. Alternatively, or in addition to size variation, the placement of the short element 119 in the antenna 100 causes the antenna 100 to be set at a particular predetermined bandwidth.

The short element 119 of the antenna 100 is in the second layer 113. In some embodiments, the short element 119 is one or more of in the first layer 101 or in the second layer 113. In some embodiments, the first redistribution layer 103 is configured to comprise the short element 119 and/or the second redistribution layer 115 is configured to comprise the short element 119. In other embodiments, the short element 119 is a separately formed element from the first redistribution layer 103 and the second redistribution layer 115.

In various embodiments, the one or more intermediate layers 111 comprise a molding compound, one or more dielectric layers, one or more isolation layers, or any other layer or type of layer included in a chip package, or any combination thereof comprising any suitable material.

In some embodiments, the antenna 100 is co-manufactured with the wafer level process, making it possible to eliminate an additional process for forming an antenna, and thereby simplifying manufacturing processes associated with antenna formation. Additionally, the antenna 100 is vertical on the wafer-level package making it possible to have an antenna that is relatively small in form factor compared to a RF die with which the antenna 100 is associated.

The antenna 100, having radiator antennas formed in the wafer-level have an improved gain of about 3 dBi, which is a significant improvement over the conventional on-die antenna having a gain of −3 dBi and the conventional on-substrate antenna having a gain of 0 dBi. The gain of about 3 dBi is adjustable to achieve a particular predetermined gain based on a positioning of the one or more through vias 117, for example. Further, the antenna 100 being at the wafer-level and incorporated into the various layers of an integrated circuit facilitates better die-to-antenna routing capabilities, for example by way of the one or more antenna inputs 109 in the first layer 101 that an on-substrate antenna cannot provide.

Figure 1B:
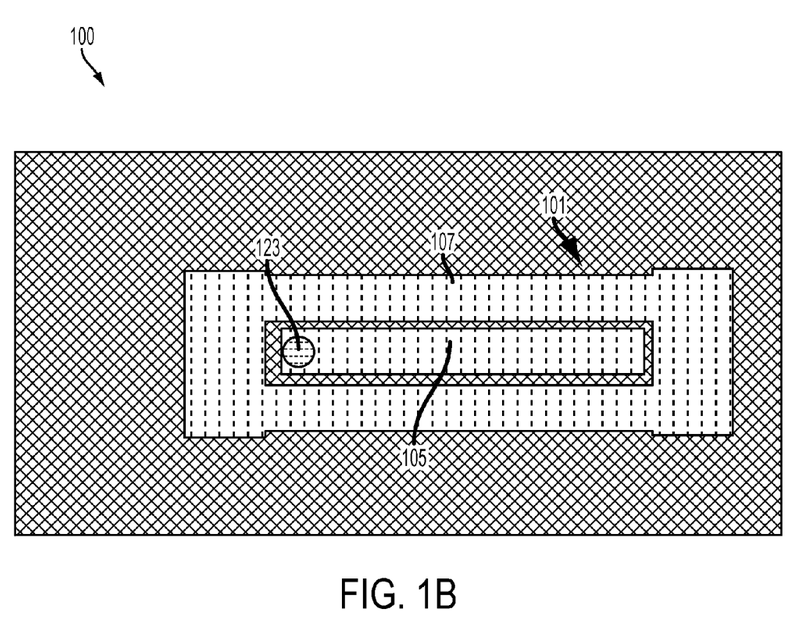
FIG. 1B is a diagram of a three-dimensional antenna having a feeding line and a ground connection element in a first redistribution layer, in accordance with one or more embodiments.

FIG. 1B is a diagram of a three-dimensional antenna 100 having feeding line 105 and the ground connection element 107 in the first redistribution layer 103, in accordance with one or more embodiments. The antenna 100, in this example embodiment, comprises only one radiator antenna 123 and is a monopole antenna.

Figure 2:
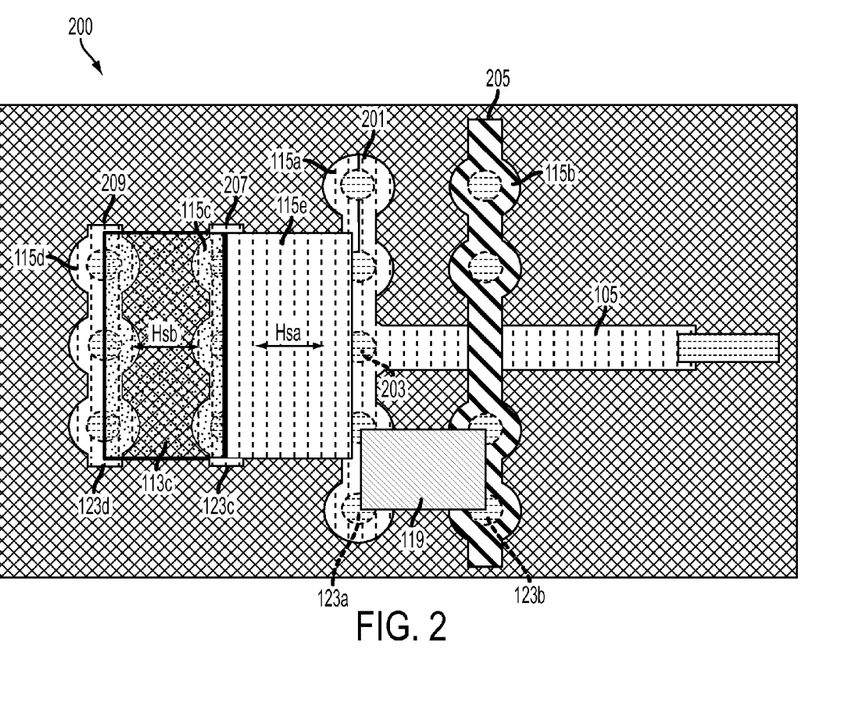
FIG. 2 is a diagram of a three-dimensional antenna having a plurality of patch walls, in accordance with one or more embodiments.

FIG. 2 is a diagram of a three-dimensional antenna 200 having a plurality of patch walls, in accordance with one or more embodiments. The three-dimensional antenna 200 comprises a first row of radiator antennas 123a having at least two radiator antennas 123 communicatively coupled by a first portion of the second redistribution layer 115a, the first row of radiator antennas 123a configured to be a patch wall 201. The first row of radiator antennas 123a is communicatively coupled to the feeding line 105 at least by way of a primary radiator antenna 203, the primary radiator antenna 203 being one of the radiator antennas of the first row of radiator antennas 123a. The three-dimensional antenna 200 also includes a second row of radiator antennas 123b having at least two radiator antennas 123 offset from the first row of radiator antennas 123a. The second row of radiator antennas 123b is communicatively coupled by a second portion of the second redistribution layer 115b. The second row of radiator antennas 123b is configured to be a ground wall 205. The second row of radiator antennas 123b is communicatively coupled to the ground connection element 107 by one or more of the radiator antennas in the second row of radiator antennas 123b.

The antenna 200 further comprises a third row of radiator antennas 123c having at least two radiator antennas 123 communicatively coupled by a third portion of the second redistribution layer 115c and a first portion of the first redistribution layer 103 (see FIG. 1) the third row of radiator antennas 123c configured to be a second patch wall 207. The antenna 200 also comprises a fourth row of radiator antennas 123d having at least two radiator antennas 123 communicatively coupled by a fourth portion of the second redistribution layer 115d and a second portion of the first redistribution layer 103 (see FIG. 1). The fourth row of radiator antennas 123d is configured to be a third patch wall 209. The third row of radiator antennas 123c is parallel to the first row of radiator antennas 123a and the fourth row of radiator antennas 123d is parallel to the third row of radiator antennas 123c. In various embodiments, the antenna 200 comprises N rows of radiator antennas 123 configured to be any quantity of patch walls and/or ground walls.

In various embodiments, a spacing Hsa between the first patch wall 201 and the second patch wall 207 is uniform with a spacing Hsb between the second patch wall 207 and the third patch wall 209 is configured to be uniform. In other embodiments, the spacing Hsa and Hsb between the patch walls 201, 207 and 209 is different. In some embodiments, the spacing Hsa and Hsb is configured to be from about 1/12 to 1/10 of the wavelength communicated to the antenna 200. The spacing between the patch walls 201, 207 and 209 affects the capacitance behavior of the patch walls 201, 207, 209. If the spacing is too close, then the capacitance behavior could cause interference with communication of a signal by way of the antenna 200. Accordingly, the spacing between the patch walls 201, 207, 209 is established at any distance as long as interfering capacitance behavior is avoided.

In some embodiments, the third row of radiator antennas 123c and/or the fourth row of radiator antennas 123d are not coupled to one another, the first row of radiator antennas 123a, and/or the feeding line 105. The non-connected third row of radiator antennas 123c and/or fourth row of radiator antennas 123d are configured to increase the gain of the antenna 200 and a direction of focus of the antenna 200. In some embodiments, a spacing between the radiator antennas 123 of each row of radiator antennas 123a, 123b, 123c and 123d is uniform. In other embodiments, the spacing between the radiator antennas 123 of each row of radiator antennas 123 is as small as possible to avoid interference between radiator antennas 123 in a same row of radiator antennas to make each of the patch walls 201, 207 and 209 perform like a sheeted material when faced with a communicated frequency. For example, in some embodiments, the spacing between radiator antennas 123 in a same row of radiator antennas such as the first row of radiator antennas 123a is about 1/8 of the wavelength or less. In other embodiments, the spacing between the radiator antennas 123 in a same row of radiator antennas such as the first row of radiator antennas 123a is greater than 1/8 of the wavelength, however.

In some embodiments, the antenna 200 further comprises a third portion of the first redistribution layer 103c. The third row of radiator antennas 123c is communicatively coupled to the fourth row of radiator antennas 123d by the third portion of the first redistribution layer 103c. The antenna 200 also comprises a fifth portion of the second redistribution layer 115e. The third row of radiator antennas is communicatively coupled to the first row of radiator antennas 123a by the fifth portion of the second redistribution layer 115e. In this example, coupling the third row of radiator antennas 123c and/or the fourth row of radiator antennas 123d creates a meandering patch wall that contiguously includes the fourth row of radiator antennas 123d, the third row of radiator antennas 123c, and the first row of radiator antennas 123a resulting in a monopole antenna.

The second redistribution layer 115 is arranged to comprise the short element 119. The first row of radiator antennas 123a is communicatively coupled to the second row of radiator antennas 123b by the short element 119. The short element 119, as discussed above, is configured to adjust a bandwidth of the antenna 200.

Various implementations of the antenna 200, having exemplary dimensions such as those discussed below, are capable of achieving gain values that significantly out perform common on-die and/or on-substrate antennas. For example, an antenna 200 having isolated patch walls 201, 207 and 209 discussed above, a dielectric material dielectric constant (Dk)=about 4 to about 6, dissipation factor (DF)= about 0.004 to about 0.006, a Patch wall size=about 800 μm to about 1200 μm×about 300 μm to about 800 μm, a Ground wall size=about 800 μm to about 1200 μm×about 300 μm to about 800 μm, a TAV height=about 400 μm to about 800 μm, and a TAV diameter/spacing=(about 10 μm to about 30 μm)/(about 40 μm to about 60 μm) is capable of yielding a Center frequency of about 80 GHz to about 120 GHz and an Antenna gain>about 3 dBi to about 7 dBi.

Similarly, various implementations of the antenna 200 configured having the short element 119 arranged in the second redistribution layer 115, the second patch wall 207 coupled to the first patch wall 201, and the third patch wall 209 coupled to the second patch wall 207, as discussed above, are also capable of achieving gain values that significantly out perform common on-die and/or on-substrate antennas. For example, an antenna 200 having the aforementioned configuration and a dielectric material dielectric constant (Dk)=about 4 to about 6, dissipation factor (DF)= about 0.004 to about 0.006, a Patch wall size=about 800 μm to about 1200 μm×about 300 μm to about 800 a Ground wall size=about 800 μm to about 1200 μm×about 300 μm to about 800 a TAV height=about 400 μm to about 800 μm, and a TAV diameter/spacing=(about 10 μm to about 30 μm)/(about 40 μm to about 60 μm) is capable of yielding a Center frequency of about 130 GHz to about 170 GHz and an Antenna gain>about 2 dBi to about 6 dBi.

Figure 3:
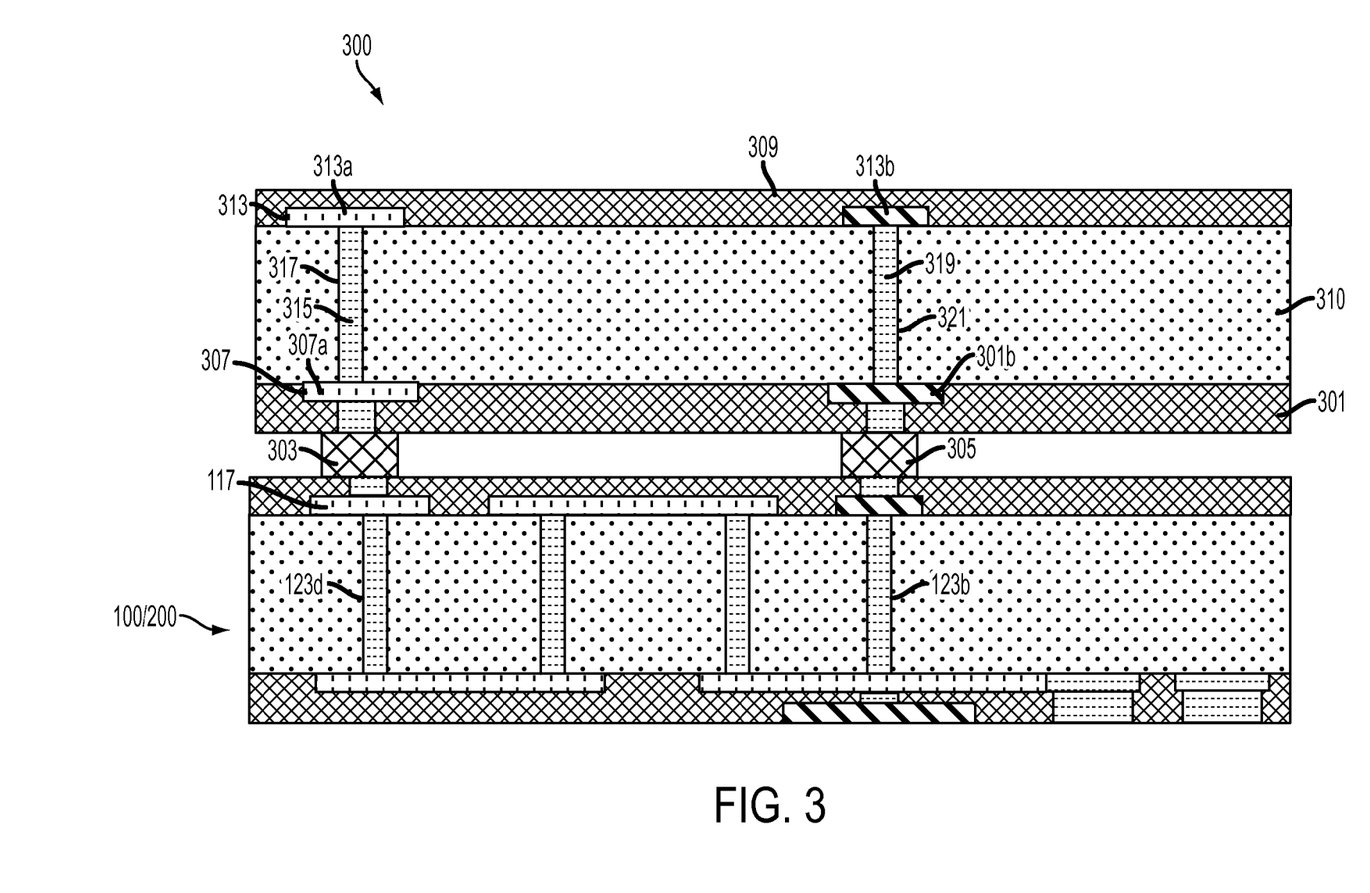
FIG. 3 is a diagram of a stacked three-dimensional antenna, in accordance with one or more embodiments.

FIG. 3 is a diagram of a stacked three-dimensional antenna 300, in accordance with one or more embodiments. The antenna 300 includes the antenna 100/200 discussed above and a third layer 301 over the second layer 113. The third layer 301 is communicatively coupled to the fourth row of radiator antennas 123d, for example, by a first bonding coupling 303. The third layer 301 is also communicatively coupled to the second row of radiator antennas 123b by a second bonding coupling 305. The third layer 301 includes a third redistribution layer 307.

In some embodiments, the third layer 301 is communicatively coupled to any or all of the rows of radiator antennas 123 by way of any quantity of bonding couplings. In various embodiments, the bonding coupling comprise any combination of copper wire structure(s), solder ball structure(s), solder ball-copper pillar joint bump structure(s), copper pillar-copper pillar joint bump structure(s), or any other suitable joinder or coupling structure.

The antenna 300 further includes a fourth layer 309 over the third layer 301 and/or one or more additional intermediate layers 310. The fourth layer 309 comprises a fourth redistribution layer 313. The antenna 300 includes a fifth row of radiator antennas 315 between the third layer 301 and the fourth layer 309. The fifth row of radiator antennas 315 is communicatively coupled by one or more of a first portion of the third redistribution layer 307a and a first portion of the fourth redistribution layer 313a. The fifth row of radiator antennas 315 having at least two radiator antennas 123 is communicatively coupled to the fourth row of radiator antennas 123d by the first bonding coupling 303. In some embodiments, the fifth row of radiator antennas 315 is configured to be a fourth patch wall 317.

The antenna 300 includes a sixth row of radiator antennas 319 between the third layer 301 and the fourth layer 309. The sixth row of radiator antennas 319 is communicatively coupled by one or more of a second portion of the third redistribution layer 307b and a second portion of the fourth redistribution layer 313b. The sixth row of radiator antennas 319 having at least two radiator antennas 123 is communicatively coupled to the second row of radiator antennas 123b by the second bonding coupling 305. The sixth row of radiator antennas 319 is configured to be a second ground wall 321.

In various embodiments, the antenna 300 is configured to comprise any quantity of rows of radiator antennas 123 and/or layers various arrangements of radiator antennas 123.

The examples described are merely exemplary and are not intended to be limiting in any way.

Figure 4:
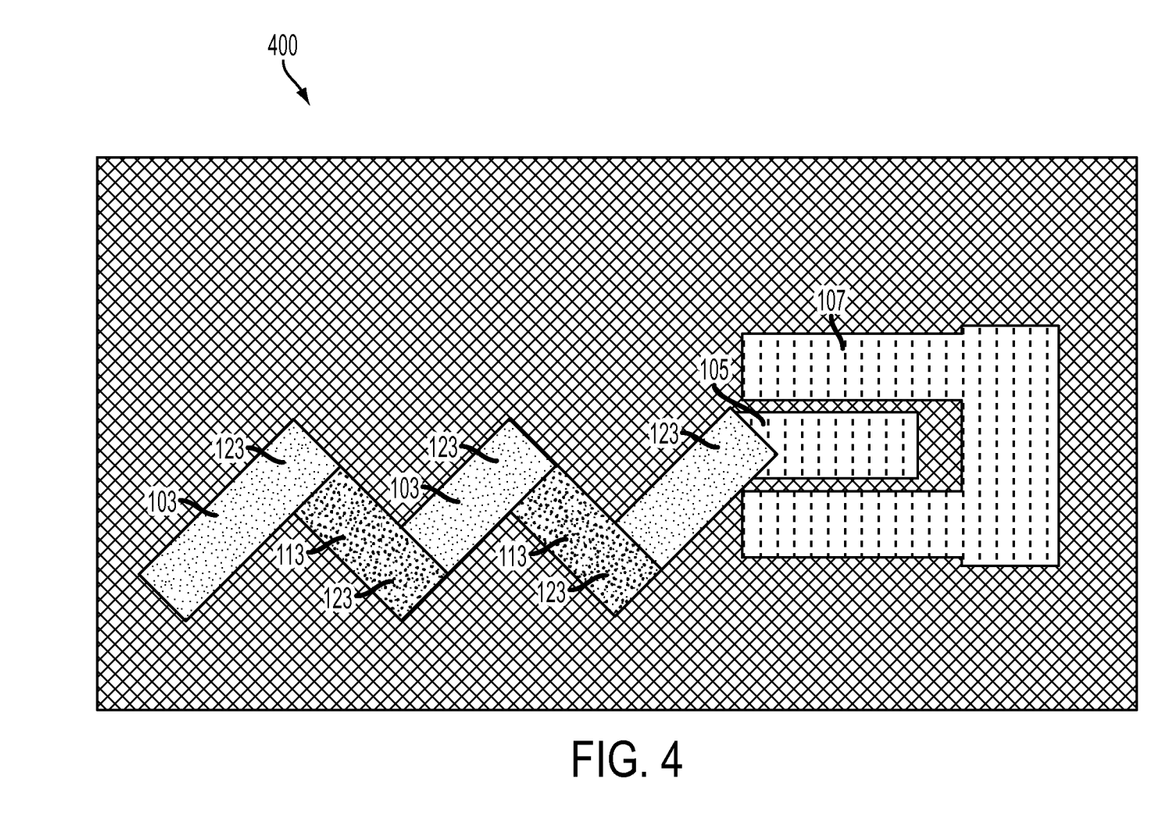
FIG. 4 is a diagram of a helical three-dimensional antenna, in accordance with one or more embodiments.

FIG. 4 is a diagram of a helical three-dimensional antenna 400, in accordance with one or more embodiments. The antenna 400 comprises radiator antennas 123 offset from one another with respect to an orientation of the feeding line 105. Antenna 400 comprises four or more radiator antennas 123. The four or more radiator antennas 123 are arranged in pairs. Some of the radiator antennas 123 forming the pairs are communicatively coupled by one of the first redistribution layer 103 and the second redistribution layer 115. The other radiator antennas 123 forming the pairs of radiator antennas 123 are communicatively coupled by the other of the first redistribution layer 103 and the second redistribution layer 115. The offset of the radiator antennas 123 results in the pairs of radiator antennas 123 that are angled such that the radiator antennas 123 form a helical pattern or orientation. The helical orientation of the antenna 400 is a monopole antenna that is configured to be arranged as a single layer antenna, but is also capable of being stacked such as a part of a multi-level antenna such as that discussed above with respect to antenna 300.

In this example, the feeding line 105 is incorporated into the first redistribution layer 103 and the ground connection element 107.

Figure 5:
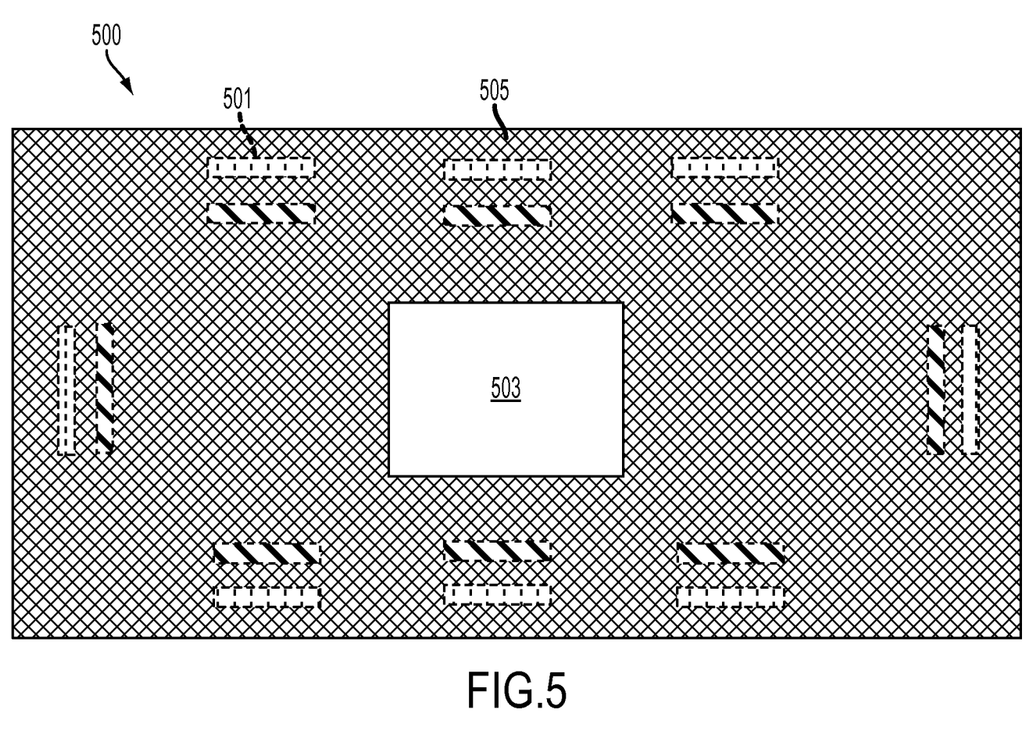
FIG. 5 is a diagram of an integrated circuit having a RF die and an array of three-dimensional antennas surrounding the RF die, in accordance with one or more embodiments.

FIG. 5 is a diagram of an integrated circuit 500 having a RF die and an array of three-dimensional antennas surrounding the RF die, in accordance with one or more embodiments. The integrated circuit 500 comprises N antennas 501 having any configuration such as those discussed above arranged around a RF die 503 on a substrate 505. In embodiments, the quantity and positioning of antennas 501 involve any number of quantities and positions around or near the RF die 503. In some embodiments, the substrate 505 is the first layer 101. In other embodiments, the substrate 505 is any other suitable layer or material of the integrated circuit 500 capable of supporting the features of the integrated circuit 500 such as, but not limited to, antenna(s) 501 and RF die 503.

Figure 6:
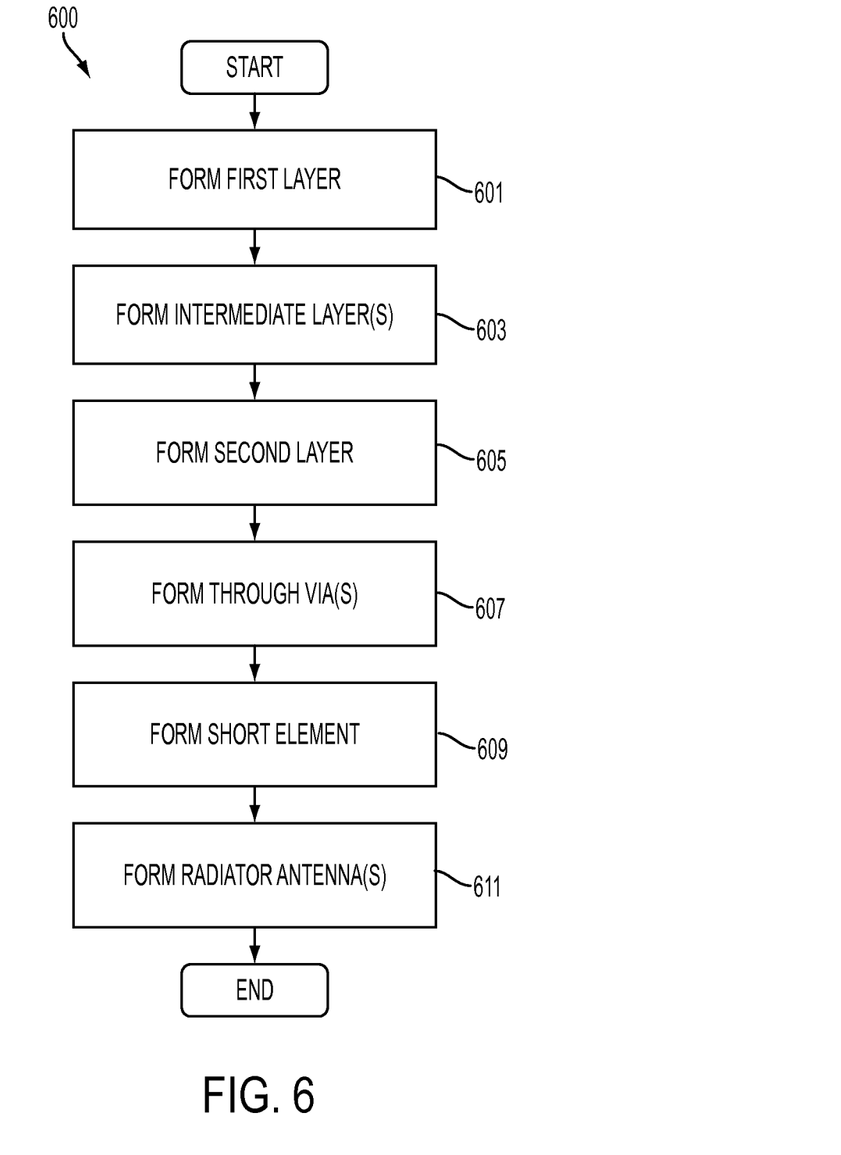
FIG. 6 is a flowchart of a process associated with forming a three-dimensional antenna, in accordance with one or more embodiments.

FIG. 6 is a flowchart of a process 600 associated with forming a three-dimensional antenna, in accordance with one or more embodiments. The process begins with step 601 in which a first layer is formed comprising a first redistribution layer, a feeding line, a ground connection element, and one or more antenna inputs. Then, in step 603, one or more intermediate layers are formed over the first layer. Next, in step 605, a second layer is formed comprising a second redistribution layer over the one or more intermediate layers.

The process continues to step 607 in which one or more through vias are formed in the second layer and the one or more intermediate layers to expose a surface of the first redistribution layer. The one or more through vias are arranged to communicatively couple the second redistribution layer and the first redistribution layer. In some embodiments, the one or more through vias are formed by an etching process or any other suitable process for forming through vias in a wafer-level construction Then, in step 609, a short element is formed. In some embodiments, the first redistribution layer is arranged in the first layer to comprise the feeding line, the ground connection element and the short element. Next, in step 611, one or more radiator antennas are input into the one or more through vias. The one or more radiator antennas are in communication with the one or more antenna inputs by way of the feeding line.

One aspect of this description relates to antenna comprising a first layer comprising a first redistribution layer, a feeding line, a ground connection element, and one or more antenna inputs. The antenna also comprises one or more intermediate layers over the first layer. The antenna further comprises a second layer comprising a second redistribution layer over the one or more intermediate layers. The antenna additionally comprises one or more through vias arranged to communicatively couple the second redistribution layer and the first redistribution layer. The antenna also comprises a short element. The antenna further comprises one or more radiator antennas within the one or more through vias, the one or more radiator antennas being in communication with the one or more antenna inputs by way of the feeding line.

Another aspect of this description relates to an integrated circuit comprising a RF die; and one or more antennas, the one or more antennas comprising a first layer comprising a first redistribution layer, a feeding line, a ground connection element, and one or more antenna inputs. The one or more antennas also comprise one or more intermediate layers over the first layer. The one or more antennas further comprise a second layer comprising a second redistribution layer over the one or more intermediate layers. The one or more antennas additionally comprise one or more through vias arranged to communicatively couple the second redistribution layer and the first redistribution layer. The one or more antennas also comprise a short element. The one or more antennas further comprise one or more radiator antennas within the one or more through vias, the one or more radiator antennas being in communication with the one or more antenna inputs by way of the feeding line.

Still another aspect of this description relates to a method of forming an antenna, the method comprising forming a first layer comprising a first redistribution layer, a feeding line, a ground connection element, and one or more antenna inputs. The method also comprises forming one or more intermediate layers over the first layer. The method further comprises forming a second layer comprising a second redistribution layer over the one or more intermediate layers. The method additionally comprises etching one or more through vias in the second layer and the one or more intermediate layers to expose a surface of the first redistribution layer, the one or more through vias arranged to communicatively couple the second redistribution layer and the first redistribution layer. The method also comprises forming a short element. The method further comprises inputting one or more radiator antennas into the one or more through vias, the one or more radiator antennas being in communication with the one or more antenna inputs by way of the feeding line.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:
1. An antenna comprising:
a first layer comprising a first redistribution layer, a feeding line, a ground connection element, and one or more antenna inputs;
one or more intermediate layers over the first layer;
a second layer comprising a second redistribution layer over the one or more intermediate layers;

one or more through vias arranged to communicatively couple the second redistribution layer and the first redistribution layer;
a shorting element; and
a plurality of radiator antennas within the one or more through vias, the plurality of radiator antennas being in communication with the one or more antenna inputs by way of the feeding line, wherein the plurality of radiator antennas comprise:
a first pair of radiator antennas coupled by a first portion of the second redistribution layer, wherein the plurality of radiator antennas is arranged as a first row of radiator antennas comprising the first pair of radiator antennas communicatively coupled by the first portion of the second redistribution layer and configured to be a patch wall communicatively coupled to the feed line at least by way of a primary radiator antenna, the primary radiator antenna being one of the radiator antennas of the first row of radiator antennas; and
a second pair of radiator antennas coupled by a second portion of the second redistribution layer, wherein the second portion of the second redistribution layer is adjacent to and substantially parallel with the first portion of the second redistribution layer in a top down view, wherein the plurality of radiator antennas is further arranged as a second row of radiator antennas comprising the second pair of radiator antennas offset from the first row of radiator antennas, the second row of radiator antennas being communicatively coupled by the second portion of the second redistribution layer and configured to be a ground wall communicatively coupled to the ground connection element by one or more of the radiator antennas in the second row of radiator antennas.

2. The antenna of claim 1, wherein the plurality of radiator antennas are offset from one another with respect to an orientation of the feeding line.

3. The antenna of claim 2, wherein the plurality of radiator antennas are arranged in additional pairs of radiator antennas, the additional pairs of radiator antennas are communicatively coupled by one of the first redistribution layer and the second redistribution layer, the additional pairs of radiator antennas are communicatively coupled to each other by the other of the first redistribution layer and the second redistribution layer, and the additional pairs of radiator antennas are arranged to form a helical pattern.

4. The antenna of claim 1, wherein the first redistribution layer is arranged in the first layer to comprise the feeding line, the ground connection element and the shorting element.

5. The antenna of claim 1, wherein some of the plurality of radiator antennas are arranged as:
a third row of radiator antennas comprising some of the plurality of radiator antennas communicatively coupled by a third portion of the second redistribution layer and a first portion of the first redistribution layer and configured to be a second patch wall; and
a fourth row of radiator antennas comprising some of the plurality of radiator antennas communicatively coupled by a fourth portion of the second redistribution layer and a second portion of the first redistribution layer and configured to be a third patch wall, wherein the third row of radiator antennas is parallel to the first row of radiator antennas and the fourth row of radiator antennas is parallel to the third row of radiator antennas.

6. The antenna of claim 5, wherein the third row of radiator antennas is communicatively coupled to the fourth row of radiator antennas by a third portion of the first redistribution layer and the third row of radiator antennas is communicatively coupled to the first row of radiator antennas by a fifth portion of the second redistribution layer.

7. The antenna of claim 6, wherein the antenna further comprises:
a third layer over the second layer, the third layer being communicatively coupled to the fourth row of radiator antennas by a first bonding coupling, communicatively coupled to the second row of radiator antennas by a second bonding coupling, and comprising a third redistribution layer; and
a fourth layer over the third layer, the fourth layer comprising a fourth redistribution layer, wherein some of the plurality of radiator antennas are arranged as a fifth row of radiator antennas between the third layer and the fourth layer, the radiator antennas of the fifth row of radiator antennas are communicatively coupled by one or more of a first portion of the third redistribution layer and a first portion of the fourth redistribution layer, the fifth row of radiator antennas is communicatively coupled to the fourth row of radiator antennas by the first bonding coupling, and the fifth row of radiator antennas is configured to be a fourth patch wall.

8. The antenna of claim 7, wherein some of the plurality of radiator antennas are arranged as a sixth row of radiator antennas between the third layer and the fourth layer, the radiator antennas of the sixth row of radiator antennas are communicatively coupled by one or more of a second portion of the third redistribution layer and a second portion of the fourth redistribution layer, the sixth row of radiator antennas is communicatively coupled to the second row of radiator antennas by the second bonding coupling, and the sixth row of radiator antennas is configured to be a second ground wall.

9. The antenna of claim 6, wherein the second redistribution layer is arranged to comprise the shorting element, the first row of radiator antennas is communicatively coupled to the second row of radiator antennas by the shorting element, and the shorting element is configured to adjust a bandwidth of the antenna.

10. An antenna comprising:
a first layer comprising a first redistribution layer, a feeding line, a ground connection element, and one or more antenna inputs;
one or more intermediate layers over the first layer;
a second layer comprising a second redistribution layer over the one or more intermediate layers;
a plurality of through vias arranged to communicatively couple the second redistribution layer and the first redistribution layer;
a shorting element; and
a plurality of radiator antennas within the plurality of through vias, the plurality of radiator antennas being in communication with the one or more antenna inputs by way of the feeding line, the plurality of radiator antennas being arranged as:
a first row of radiator antennas comprising first ones of the plurality of radiator antennas communicatively coupled by a first portion of the second redistribution layer and configured to be a patch wall communicatively coupled to the feed line at least by way of a primary radiator antenna, the primary radiator antenna being one of the radiator antennas of the first row of radiator antennas; and a second row of radiator antennas comprising second ones of the plurality of radiator antennas offset from and parallel to the first row of radiator antennas in a top down view, the second row of radiator antennas being communicatively coupled by a second portion of the second redistribution layer and configured to be a ground wall communicatively coupled to the ground connection element by one or more of the radiator antennas in the second row of radiator antennas.

11. The antenna of claim 10, wherein at least the plurality of radiator antennas are arranged as part of an array around a radio frequency die on a substrate.

12. The antenna of claim 10, wherein third ones of the plurality of radiator antennas are arranged as:
   a third row of radiator antennas comprising some of the plurality of radiator antennas communicatively coupled by a third portion of the second redistribution layer and a first portion of the first redistribution layer and configured to be a second patch wall; and
   a fourth row of radiator antennas comprising some of the plurality of radiator antennas communicatively coupled by a fourth portion of the second redistribution layer and a second portion of the first redistribution layer and configured to be a third patch wall, wherein the third row of radiator antennas is parallel to the first row of radiator antennas and the fourth row of radiator antennas is parallel to the third row of radiator antennas.

13. The antenna of claim 12, wherein the third row of radiator antennas is communicatively coupled to the fourth row of radiator antennas by a third portion of the first redistribution layer and the third row of radiator antennas is communicatively coupled to the first row of radiator antennas by a fifth portion of the second redistribution layer.

14. The antenna of claim 13, wherein the antenna further comprises:
   a third layer over the second layer, the third layer being communicatively coupled to the fourth row of radiator antennas by a first bonding coupling, communicatively coupled to the second row of radiator antennas by a second bonding coupling, and comprising a third redistribution layer; and
   a fourth layer over the third layer, the fourth layer comprising a fourth redistribution layer, wherein fifth ones of the plurality of radiator antennas are arranged as a fifth row of radiator antennas between the third layer and the fourth layer, the radiator antennas of the fifth row of radiator antennas are communicatively coupled by one or more of a first portion of the third redistribution layer and a first portion of the fourth redistribution layer, the fifth row of radiator antennas is communicatively coupled to the fourth row of radiator antennas by the first bonding coupling, and the fifth row of radiator antennas is configured to be a fourth patch wall.

15. The antenna of claim 14, wherein sixth ones of the plurality of radiator antennas are arranged as a sixth row of radiator antennas between the third layer and the fourth layer, the radiator antennas of the sixth row of radiator antennas are communicatively coupled by one or more of a second portion of the third redistribution layer and a second portion of the fourth redistribution layer, the sixth row of radiator antennas is communicatively coupled to the second row of radiator antennas by the second bonding coupling, and the sixth row of radiator antennas is configured to be a second ground wall.

16. The antenna of claim 13, wherein the second redistribution layer is arranged to comprise the shorting element, the first row of radiator antennas is communicatively coupled to the second row of radiator antennas by the shorting element, and the shorting element is configured to adjust a bandwidth of the antenna.

17. A method of forming an antenna, the method comprising:
   forming a first layer comprising a first redistribution layer, a feeding line, a ground connection element, and one or more antenna inputs;
   forming one or more intermediate layers over the first layer;
   forming a second layer comprising a second redistribution layer over the one or more intermediate layers, wherein the second redistribution layer comprises a first portion and a second portion adjacent and substantially parallel to the first portion in a top down view;
   etching a plurality of through vias in the second layer and the one or more intermediate layers to expose a surface of the first redistribution layer, the one or more through vias being arranged to communicatively couple the second redistribution layer and the first redistribution layer;
   forming a shorting element; and
   forming a plurality radiator antennas in the plurality of through vias, the radiator antenna being in communication with the one or more antenna inputs by way of the feeding lines, wherein first ones of the plurality of radiator antennas are coupled by the first portion of the second redistribution layer, wherein second ones of the plurality of radiator antennas are coupled by the second portion of the second redistribution layer, and wherein an edge of the shorting element spans a distance between the first portion of the second redistribution layer and the second portion of the second redistribution layer in the top down view.

18. The method of claim 17, wherein the first redistribution layer is arranged in the first layer to comprise the feeding line, the ground connection element and the shorting element.

19. The method of claim 17, further comprising:
   forming the antenna as part of an array around a radio frequency die on a substrate.

* * * * *